US010578671B2

(12) United States Patent
Shen

(10) Patent No.: US 10,578,671 B2
(45) Date of Patent: Mar. 3, 2020

(54) SEMICONDUCTOR DEVICE

(71) Applicant: ABLIC Inc., Chiba-shi, Chiba (JP)

(72) Inventor: Biao Shen, Chiba (JP)

(73) Assignee: ABLIC INC., Chiba (JP)

( * ) Notice: Subject to any disclaimer, the term of this patent is extended or adjusted under 35 U.S.C. 154(b) by 54 days.

(21) Appl. No.: 15/918,431

(22) Filed: Mar. 12, 2018

(65) Prior Publication Data

US 2018/0267100 A1 Sep. 20, 2018

(30) Foreign Application Priority Data

Mar. 14, 2017 (JP) ................................ 2017-048803

(51) Int. Cl.
*G01R 31/316* (2006.01)
*G01R 31/317* (2006.01)
*G01R 31/3183* (2006.01)

(52) U.S. Cl.
CPC ..... *G01R 31/31724* (2013.01); *G01R 31/316* (2013.01); *G01R 31/318385* (2013.01)

(58) Field of Classification Search
CPC ...... G01R 31/31724; G01R 31/318385; G01R 31/316
See application file for complete search history.

(56) References Cited

U.S. PATENT DOCUMENTS

| 5,546,406 A | 8/1996 | Gillenwater et al. | |
|---|---|---|---|
| 2007/0226568 A1* | 9/2007 | Anzou | G01R 31/31721 714/733 |
| 2014/0258798 A1* | 9/2014 | Ahmed | G01R 714/727 714/727 |
| 2014/0289576 A1* | 9/2014 | Maekawa | G01R 31/318544 714/727 |
| 2016/0091564 A1* | 3/2016 | Li | G01R 31/318544 714/727 |
| 2017/0074939 A1* | 3/2017 | Anzou | G01R 31/31724 |
| 2018/0059183 A1* | 3/2018 | Maeda | G01R 31/318547 |
| 2018/0080986 A1* | 3/2018 | DeForge | G01R 31/31724 |

OTHER PUBLICATIONS

"Design for Test in Encounter RTL Compiler, Product Version 14.2—Inserting Logic Built-In-Self-Test Logic", *Cadence*, Aug. 2015, 45 pages.

* cited by examiner

*Primary Examiner* — Dominic E Hawkins
(74) *Attorney, Agent, or Firm* — Brinks Gilson & Lione

(57) ABSTRACT

To provide a semiconductor device capable of easily testing a built-in self-test control circuit itself, the semiconductor device has: a test pattern generator; an output response analyzer configured to compare an expected value to a test result of a circuit; a plurality of test control circuits each configured to control the test pattern generator and the output response analyzer; and a circuit under test. The semiconductor device has: a first test mode in which a first test control circuit controls the test pattern generator and the output response analyzer to cause the test pattern, to thereby perform a test; and a second test mode in which the test control circuit other than the first test control circuit controls the test pattern generator and the output response analyzer to cause the test pattern, to thereby perform a test.

2 Claims, 3 Drawing Sheets

SEMICONDUCTOR DEVICE

RELATED APPLICATIONS

This application claims priority under 35 U.S.C. § 119 to Japanese Patent Application No. 2017-048803 filed on Mar. 14, 2017, the entire content of which is hereby incorporated by reference.

BACKGROUND OF THE INVENTION

1. Field of the Invention

The present invention relates to a semiconductor device.

2. Description of the Related Art

There has hitherto been known a built-in self-test as a method of testing a large-scale integrated circuit (LSI) as described in, for example, U.S. Pat. No. 5,546,406.

In addition, there has hitherto been known a technology of testing, in a semiconductor device configured to perform a built-in self-test, a built-in self-test control circuit itself with use of an external device as described in, for example, Design For Test in Encounter RTL Compiler Product Version 14.2 August 2015, Chapter 18: Inserting Logic Built-In-Self-Test Logic.

However, it is preferred that no external device is used for a test of the built-in self-test control circuit itself to reduce time and effort necessary for setting and connection of the external device.

SUMMARY OF THE INVENTION

The present invention provides a semiconductor device configured to perform a built-in self-test in which a built-in self-test control circuit itself can be easily tested.

According to one embodiment of the present invention, there is provided a semiconductor device having: a test pattern generator configured to generate a test pattern; a circuit under test configured to output, in response to the supply of the test pattern from the test pattern generator, a test result in accordance with the test pattern; an output response analyzer configured to compare an expected value to the test result; and a plurality of test control circuits configured to control the test pattern generator and the output response analyzer, the semiconductor device also having: a first test mode in which a first test control circuit of the plurality of test control circuits controls the test pattern generator and the output response analyzer to cause the test pattern to be supplied to a test control circuit of the plurality of test control circuits other than the first test control circuit, to thereby perform a test; and a second test mode in which the test control circuit other than the first test control circuit controls the test pattern generator and the output response analyzer to cause the test pattern to be supplied to the first test control circuit, to thereby perform a test.

According to the present invention, it is possible to provide the semiconductor device configured to perform the built-in self-test in which the built-in self-test control circuit itself can be easily tested.

DETAILED DESCRIPTION OF THE EMBODIMENTS

First Embodiment

Now, a first embodiment of the present invention is described with reference to the drawings.

Figure 1:
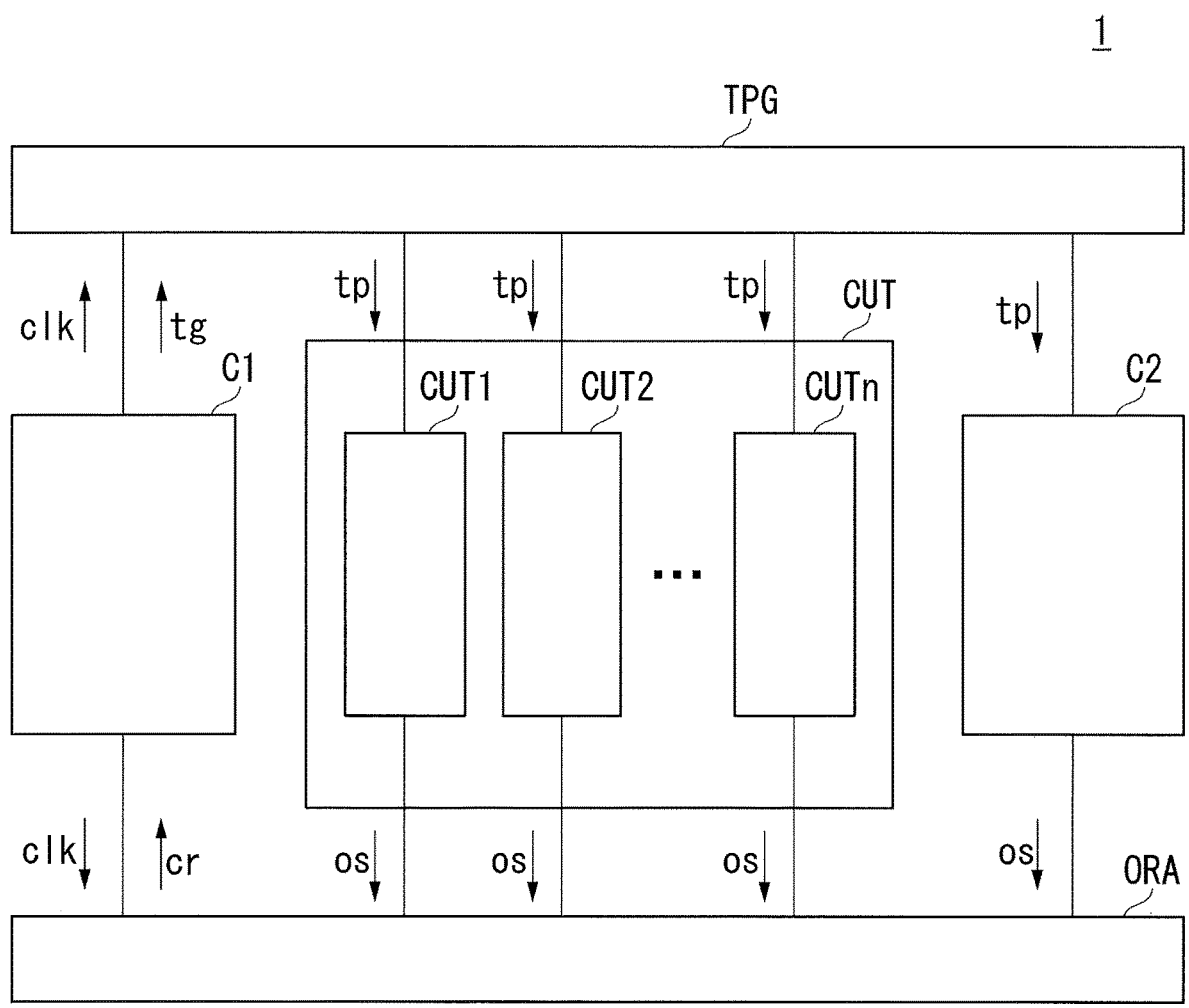
FIG. 1 is a first diagram for illustrating an outline of a semiconductor device according to a first embodiment of the present invention.

FIG. 1 is a first diagram for illustrating an outline of a semiconductor device 1 according to the first embodiment. The semiconductor device 1 configured to perform a built-in self-test has a circuit under test (hereinafter referred to as "circuit under test CUT"), a test pattern generator (hereinafter referred to as "test pattern generator TPG"), an output response analyzer (hereinafter referred to as "output response analyzer ORA"), and a plurality of test control circuits C. In the following description, the semiconductor device 1 configured to perform the built-in self-test is simply referred to as "semiconductor device 1".

The circuit under test CUT is a circuit to be subjected to the built-in self-test. The circuit under test CUT is a digital circuit configured to output a digital signal, for example, in response to input of a digital signal. In the example of the first embodiment, the semiconductor device 1 has a circuit under test CUT1, a circuit under test CUT2, . . . , and a circuit under test CUTn, where n is a natural number. In the following description, the circuit under test CUT1, the circuit under test CUT2, . . . , and the circuit under test CUTn are collectively referred to as "circuit under test CUT" when the circuit under test CUT1, the circuit under test CUT2, . . . , and the circuit under test CUTn are not distinguished.

The test pattern generator TPG generates (produces) a test pattern tp and inputs (supplies) the test pattern tp to the circuit under test CUT. The test pattern tp is, for example, a pseudorandom number. The output response analyzer ORA has a division circuit (Multi-Input Signature Register: MISR) and an expected value comparison circuit. The output response analyzer ORA compares an expected value to a value calculated from an output signal os with use of the expected value comparison circuit to determine go/no-go of operation of the circuit under test CUT. The output signal os is a signal that is output from the circuit under test CUT in response to input of the test pattern tp. The expected value is a value indicating a remainder obtained in the division circuit by dividing the output signal os, which is provided from the circuit under test CUT in response to input of the test pattern tp, by a predetermined value when the circuit under test CUT has no fault. The output response analyzer ORA thus determines that a fault has occurred in the circuit under test CUT when there is a difference between the expected value and a value (remainder) calculated based on the output signal os output from the circuit under test CUT.

A case in which the output response analyzer ORA has the division circuit is described above, but the output response analyzer ORA is not limited thereto. The output response analyzer ORA may have an arithmetic circuit other than the division circuit. The output response analyzer ORA may have, for example, an adder circuit instead of the division circuit. In this case, the expected value is a value obtained by adding the output signal os output from the circuit under test CUT in response to input of the test pattern tp when the circuit under test CUT has no fault, to a predetermined value.

The test control circuits C each control the test pattern generator TPG and the output response analyzer ORA. For example, the test control circuits C output a control signal, for example, a clock signal clk or a trigger signal tg, to the test pattern generator TPG to cause the test pattern generator TPG to generate and supply the test pattern tp. For example, the test control circuits C acquire a comparison result cr obtained by comparing the expected value to a value (remainder) calculated by the output response analyzer ORA based on the output signal os from the circuit under test CUT and a predetermined value (in this example, the clock signal clk supplied from the test control circuits C).

In the example of the first embodiment, the semiconductor device 1 has a first test control circuit C1 and a second test control circuit C2. In the following description, the first test control circuit C1 and the second test control circuit C2 are collectively referred to as "test control circuits C" when the first test control circuit C1 and the second test control circuit C2 are not distinguished.

Now, description is given to a case in which the second test control circuit C2 is tested as a circuit to be tested by the first test control circuit C1. The second test control circuit C2 receives input of the test pattern tp from the test pattern generator TPG, and outputs the output signal os based on the test pattern tp to the output response analyzer ORA. In this case, the second test control circuit C2 performs a similar operation as that of the circuit under test CUT. Specifically, the second test control circuit C2 outputs the output signal os in response to input of a digital signal. The output response analyzer ORA determines go/no-go of operation of the second test control circuit C2 based on the output signal os output from the second test control circuit C2. For example, the output response analyzer ORA compares the expected value to a value (remainder) calculated based on the output signal os output from the second test control circuit C2 and the clock signal clk supplied from the first test control circuit C1, to thereby determine go/no-go of the operation of the second test control circuit C2. The expected value is a remainder calculated based on the clock signal clk and the output signal os output from the second test control circuit C2 in response to input of the test pattern tp when the second test control circuit C2 has no fault.

Also in a case in which the first test control circuit C1 is tested as a circuit to be tested by the second test control circuit C2, the same operation is performed while the functions of the first test control circuit C1 and the functions of the second test control circuit C2 described above are interchanged, and hence description of that case is omitted.

The built-in self-test has two test modes, namely, a first test mode and a second test mode. Specifically, the semiconductor device 1 performs the built-in self-test in the first test mode, and then performs the built-in self-test in the second test mode.

As illustrated in FIG. 1, in the first test mode, one test control circuit C (in this example, the first test control circuit C1) controls each of the test pattern generator TPG and the output response analyzer ORA.

Further, a test control circuit C (in this example, the second test control circuit C2) other than the one test control circuit C performs a similar operation as that of the circuit under test CUT. In this case, the second test control circuit C2 outputs the output signal os to the output response analyzer ORA in response to input of the test pattern tp from the test pattern generator TPG.

Figure 2:
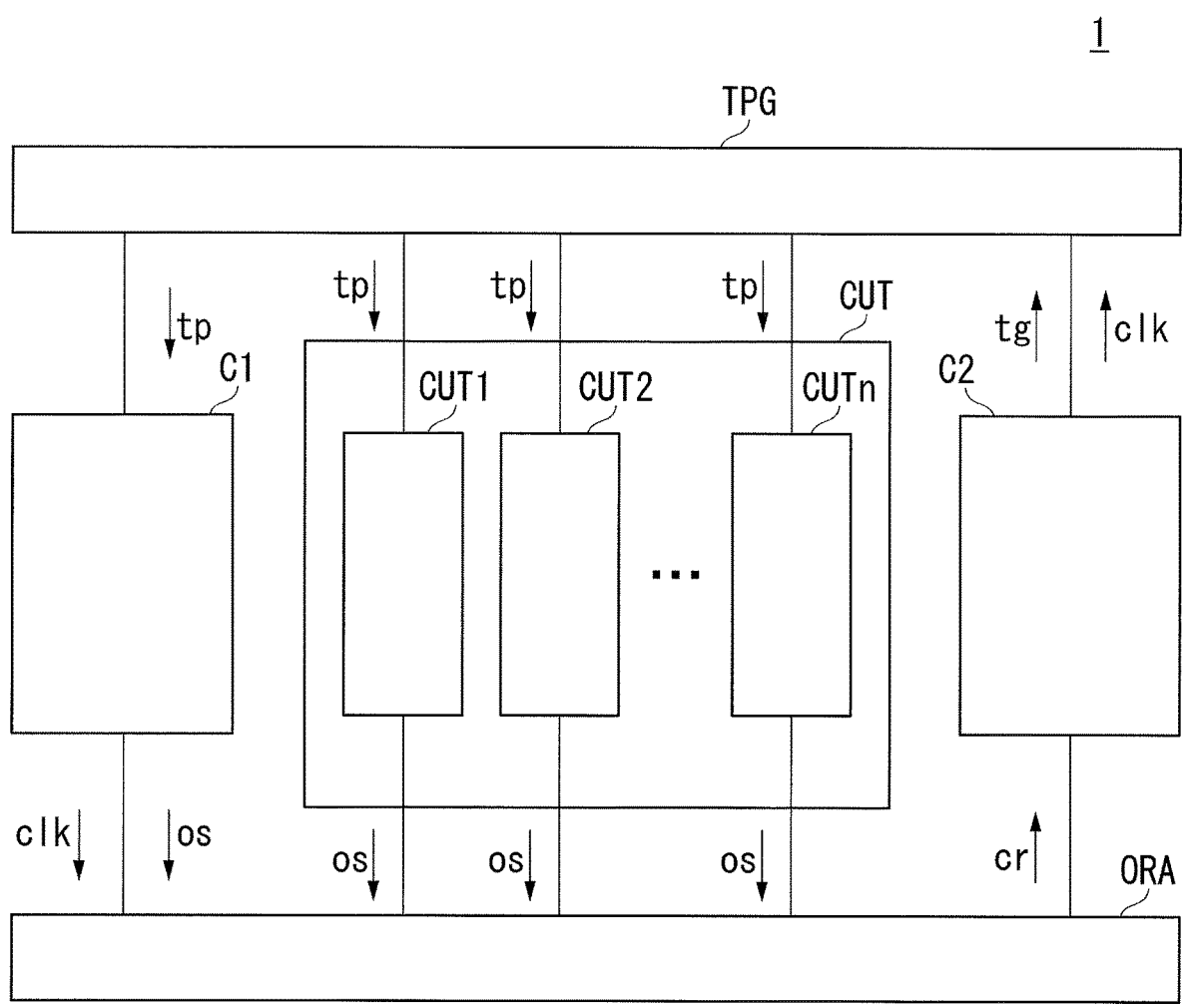
FIG. 2 is a second diagram for illustrating the outline of the semiconductor device according to the first embodiment.

FIG. 2 is a second diagram for illustrating the outline of the semiconductor device 1 according to the first embodiment.

As illustrated in FIG. 2, in the second test mode, the test control circuit C (in this example, the second test control circuit C2) other than the one test control circuit C controls each of the test pattern generator TPG and the output response analyzer ORA, and the one test control circuit C (in this example, the first test control circuit C1) performs a similar operation as that of the circuit under test CUT. In this case, the first test control circuit C1 outputs the output signal os to the output response analyzer ORA in response to input of the test pattern tp from the test pattern generator TPG.

The case in which the semiconductor device 1 has at least two test control circuits C is described above, but the semiconductor device 1 is not limited thereto. The semiconductor device 1 may have three test control circuits C or more. In this case, the semiconductor device 1 has a configuration in which a test control circuit C tests test control circuits C other than that test control circuit C at least once.

In this case, the circuit under test CUT may be tested each time the test control circuits C are tested. Further, the circuit under tests CUT may be tested dividedly in accordance with the number of tests of the test control circuits C. When the circuit under tests CUT are tested dividedly in accordance with the number of tests of the test control circuits C, for example, in a case in which the number of tests is two, a part of the circuit under test CUT is tested in the first test, and another part of the circuit under test CUT is tested in the second test.

The case in which the semiconductor device 1 performs the built-in self-test in the first test mode and then performs the built-in self-test in the second test mode is described above, but the semiconductor device 1 is not limited thereto. The semiconductor device 1 may perform the built-in self-test in the second test mode, and then perform the built-in self-test in the first test mode.

Summary of First Embodiment

As described above, the semiconductor device 1 according to the first embodiment has the plurality of test control circuits C. Further, in the semiconductor device 1 according to the first embodiment, when the one test control circuit C (in the example of the first embodiment, the first test control circuit C1) controls each of the test pattern generator TPG and the output response analyzer ORA, the test control circuit C (in the example of the first embodiment, the second test control circuit C2) other than the one test control circuit C performs as the circuit under test CUT. Meanwhile, in the semiconductor device 1 according to the first embodiment, when the test control circuit C (in the example of the first embodiment, the second test control circuit C2) other than the one test control circuit C controls each of the test pattern generator TPG and the output response analyzer ORA, the one test control circuit C (in the example of the first embodiment, the first test control circuit C1) performs as the circuit under test CUT.

In some cases in which the semiconductor device 1 has only one test control circuit, it is difficult to determine whether or not that test control circuit is operating normally. The semiconductor device 1 according to the first embodiment which has the plurality of test control circuits C, determines go/no-go of the operation of the test control circuits C as a circuit under test CUT. For example, the semiconductor device 1 can determine whether or not the first test control circuit C1 has a fault by controlling, by the second test control circuit C2, the test pattern generator TPG and the output response analyzer ORA. Further, for example, the semiconductor device 1 can determine whether or not the second test control circuit C2 has a fault by controlling, by the first test control circuit C1, the test pattern generator TPG and the output response analyzer ORA.

In this manner, the semiconductor device 1 can determine go/no-go of the operation of the test control circuits C. Consequently, the semiconductor device 1 according to the first embodiment can test the test control circuits C with use of an easy method.

In addition, the semiconductor device 1 according to the first embodiment has the circuit under test CUT whose go/no-go of the operation is determined by the test pattern generator TPG and the output response analyzer ORA controlled by the plurality of test control circuits C. Consequently, the semiconductor device 1 according to the first embodiment can determine go/no-go of the operation of the circuit under test CUT under a state in which the test control circuits C are operating normally.

Second Embodiment

Now, a second embodiment of the present invention is described with reference to the drawings.

In the first embodiment, the case in which the semiconductor device 1 determines go/no-go of the operation of the circuit under test CUT is described. In the second embodiment, description is given on a case in which a semiconductor device 2 determines go/no-go of operation of circuits other than the circuit under test CUT.

Components similar to those of the first embodiment described above are denoted by the same reference symbols, and description thereof is omitted.

Figure 3:
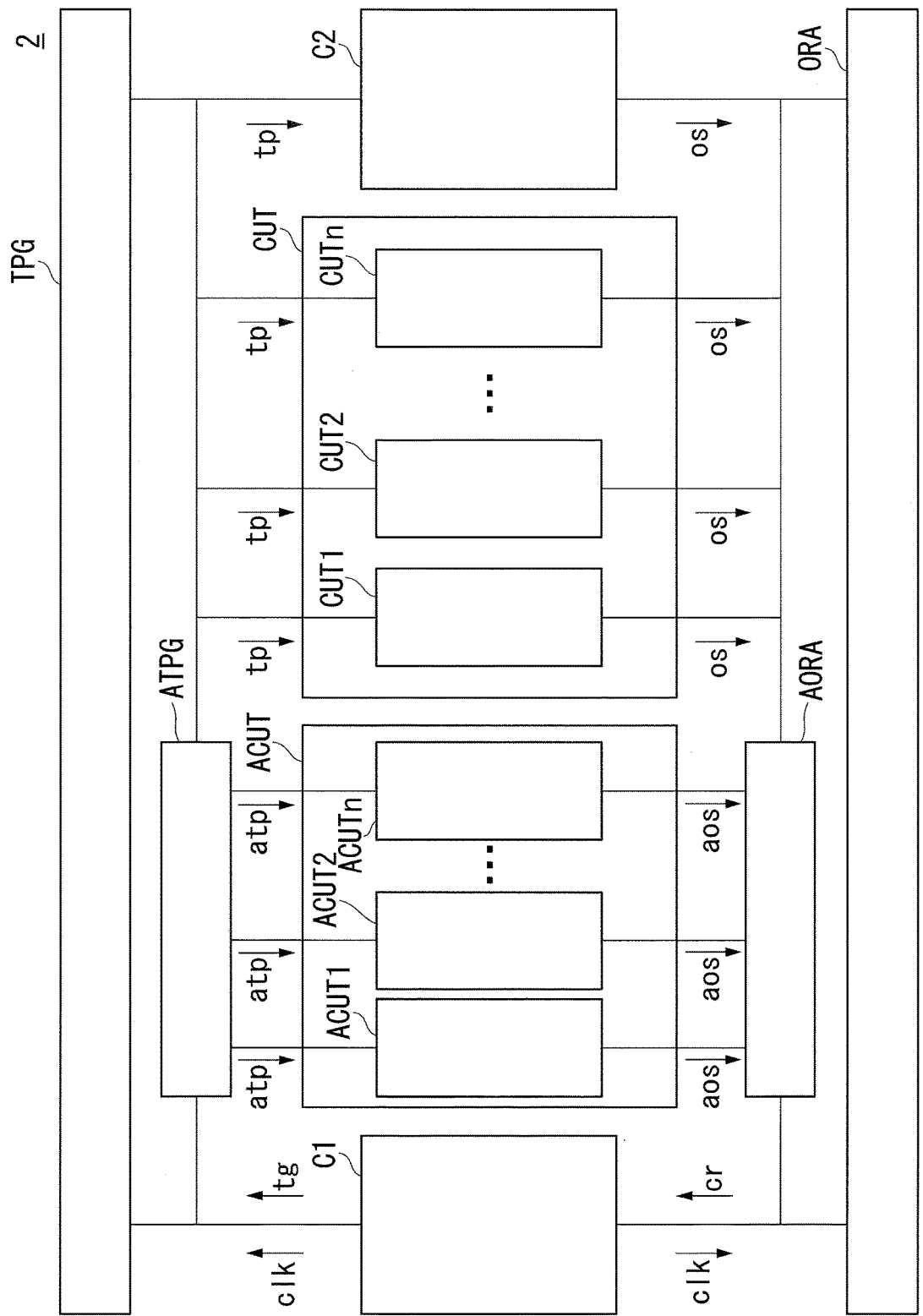
FIG. 3 is a diagram for illustrating an outline of a semiconductor device according to a second embodiment of the present invention.

FIG. 3 is a diagram for illustrating an outline of the semiconductor device 2 according to the second embodiment.

The semiconductor device 2 according to the second embodiment has a circuit under test CUT, a test pattern generator TPG, an output response analyzer ORA, a plurality of test control circuits C (first test control circuit C1 and second test control circuit C2), an analog circuit under test ACUT, an analog test pattern generator ATPG, and an analog output response analyzer AORA.

The analog circuit under test ACUT is a circuit to be subjected to the built-in self-test. The analog circuit under test ACUT is a circuit in which at least one of an input signal or an output signal is an analog signal to be processed. In the example of the second embodiment, a case in which the analog circuit under test ACUT is an analog circuit configured to output an analog signal in response to input of an analog signal is described.

In the example of the second embodiment, the semiconductor device 2 has an analog circuit under test ACUT1, an analog circuit under test ACUT2, . . . , and an analog circuit under test ACUTn, where n is a natural number. In the following description, the analog circuit under test ACUT1, the analog circuit under test ACUT2, . . . , and the analog circuit under test ACUTn are collectively referred to as "analog circuit under test ACUT" when the analog circuit under test ACUT1, the analog circuit under test ACUT2, . . . , and the analog circuit under test ACUTn are not distinguished.

The analog test pattern generator ATPG generates and supplies an analog test pattern atp to input the analog test pattern atp to the analog circuit under test ACUT. The analog output response analyzer AORA compares an expected value to an analog output signal aos output from the analog circuit under test ACUT in response to input of the analog test pattern atp, and holds a result of determination of go/no-go of operation of the analog circuit under test ACUT. The expected value is the analog output signal aos or a variety thereof (for example, in a case of analog input and digital output) output by the analog circuit under test ACUT in response to input of the analog test pattern atp when the analog circuit under test ACUT has no fault. The analog output response analyzer AORA thus determines that a fault has occurred in the analog circuit under test ACUT when there is a difference between the expected value and the analog output signal aos output from the analog circuit under test ACUT.

The test control circuits C each control the test pattern generator TPG, the analog test pattern generator ATPG, the output response analyzer ORA, and the analog output response analyzer AORA. For example, the test control circuits C output a control signal, for example, a clock signal clk or a trigger signal tg, to the analog test pattern generator ATPG to cause the analog test pattern generator ATPG to generate and supply the analog test pattern atp. For example, the test control circuits C acquire a comparison result cr obtained by comparing the expected value to the analog output signal aos from the analog circuit under test ACUT held by the analog output response analyzer AORA.

As illustrated in FIG. 3, in the first test mode, one test control circuit C (in this example, the first test control circuit C1) controls each of the test pattern generator TPG, the analog test pattern generator ATPG, the output response analyzer ORA, and the analog output response analyzer AORA.

Further, a test control circuit C (in this example, the second test control circuit C2) other than the one test control circuit C performs a similar operation as that of the circuit under test CUT. In this case, the second test control circuit C2 outputs the output signal os to the output response analyzer ORA in response to input of the test pattern tp from the test pattern generator TPG.

In the second test mode, the test control circuit C (in this example, the second test control circuit C2) other than the one test control circuit C controls each of the test pattern generator TPG, the analog test pattern generator ATPG, the output response analyzer ORA, and the analog output response analyzer AORA, and the one test control circuit C (in this example, the first test control circuit C1) performs a similar operation as that of the circuit under test CUT. In this case, the first test control circuit C1 outputs the output signal os to the output response analyzer ORA in response to input of the test pattern tp from the test pattern generator TPG.

Summary of Second Embodiment

As described above, the semiconductor device 2 according to the second embodiment has the plurality of test control circuits C (in the example of the second embodiment, the first test control circuit C1 and the second test control circuit C2), the test pattern generator TPG, the output response analyzer ORA, the analog circuit under test ACUT, the analog test pattern generator ATPG, and the analog output response analyzer AORA.

Through use of the semiconductor device 2 according to the second embodiment, it is possible to determine go/no-go of operation of a circuit (in the example of the second embodiment, the analog circuit under test ACUT) whose go/no-go of the operation cannot be determined by the test pattern generator TPG and the output response analyzer ORA.

In the first and second embodiments described above, the semiconductor device 1 and the semiconductor device 2 are examples of the built-in self-test control circuit. Further, the output signal os and the analog output signal aos are examples of the test result. Still further, the analog circuit under test ACUT is an example of a second circuit under test.

What is claimed is:

1. A semiconductor device, comprising:
    a test pattern generator configured to generate a test pattern;
    a circuit under test configured to output, in response to the supply of the test pattern from the test pattern generator, a test result in accordance with the test pattern,
    an output response analyzer configured to compare an expected value to the test result; and
    a plurality of test control circuits configured to control the test pattern generator and the output response analyzer;
    the semiconductor device having:
        a first test mode in which a first test control circuit of the plurality of test control circuits controls the test pattern generator and the output response analyzer to cause the test pattern to be supplied to a test control circuit of the plurality of test control circuits other than the first test control circuit, to thereby perform a test; and
        a second test mode in which a second test control circuit different from the first test control circuit controls the test pattern generator and the output response analyzer to cause the test pattern to be supplied to the first test control circuit, to thereby perform a test.

2. A semiconductor device according to claim 1, further comprising:
    a second circuit under test;
    a second test pattern generator configured to generate a second test pattern to be supplied to the second circuit under test; and
    a second output response analyzer configured to compare an expected value to a test result of the second circuit under test, the test result being obtained as a result of supply of the second test pattern generated by the second test pattern generator to the second circuit under test,
    the first test control circuit being configured to perform a test in the first test mode by controlling the second test pattern generator and the second output response analyzer to cause the second test pattern to be supplied to the second circuit under test,
    a second test control circuit different from the first test control circuit being configured to perform a test in the second test mode by controlling the second test pattern generator and the second output response analyzer to cause the second test pattern to be supplied to the second circuit under test.

* * * * *